(12) United States Patent
Ishikawa et al.

(10) Patent No.: US 7,148,609 B2
(45) Date of Patent: Dec. 12, 2006

(54) STRUCTURES FOR SUPPORTING VIBRATORS

(75) Inventors: Seiji Ishikawa, Aichi-prefecture (JP); Makoto Tani, Inazawa (JP); Shigeki Hayashi, Aichi-prefecture (JP)

(73) Assignee: NGK Insulators, Ltd., Nagoya (JP)

( * ) Notice: Subject to any disclaimer, the term of this patent is extended or adjusted under 35 U.S.C. 154(b) by 160 days.

(21) Appl. No.: 10/842,250

(22) Filed: May 10, 2004

(65) Prior Publication Data

US 2004/0226978 A1 Nov. 18, 2004

(30) Foreign Application Priority Data

May 12, 2003 (JP) ............................ P2003-132920

(51) Int. Cl.
*H01L 41/08* (2006.01)
(52) U.S. Cl. ....................... 310/351; 310/348
(58) Field of Classification Search ......... 310/351–356
See application file for complete search history.

(56) References Cited

U.S. PATENT DOCUMENTS

| 3,046,423 | A | * | 7/1962 | Wolfskill et al. | ........... 310/346 |
| 3,054,915 | A | * | 9/1962 | Houck | ........... 310/326 |
| 3,906,249 | A | * | 9/1975 | Gibert et al. | ........... 310/352 |
| 4,104,553 | A | * | 8/1978 | Engdahl et al. | ........... 310/352 |
| 4,494,033 | A | * | 1/1985 | Morse et al. | ........... 310/352 |
| 6,288,478 | B1 | * | 9/2001 | Ishitoko et al. | ........... 310/352 |
| 6,720,714 | B1 | * | 4/2004 | Ishitoko et al. | ........... 310/351 |
| 6,822,375 | B1 | * | 11/2004 | Mori et al. | ........... 310/351 |
| 2002/0166380 | A1 | | 11/2002 | Koike | |
| 2003/0084727 | A1 | | 5/2003 | Mori | |
| 2003/0141340 | A1 | | 7/2003 | Ishikawa et al. | |

FOREIGN PATENT DOCUMENTS

| JP | 2000-146593 A1 | 5/2000 |
| JP | 2001-12955 A1 | 1/2001 |
| JP | 2003-28648 A1 | 1/2003 |

* cited by examiner

*Primary Examiner*—Mark Budd
(74) *Attorney, Agent, or Firm*—Burr & Brown

(57) ABSTRACT

An object of the present invention is to provide a novel structure of supporting a vibrator having a terminal for electrical connection so that the vibrator can be miniaturized, and the driving impedance can be made constant in a wide temperature range to reduce the temperature drift. The structure has a substrate and bonding wires 45, 46 supported on the surface of the substrate and to be connected with the vibrator. The vibrator is supported with the bonding wire so that the vibrator is not directly contacted with the substrate. The bonding wire is electrically connected with the terminal. The resonance frequency "fr" of the supporting structure, the driving frequency "fd" for the vibrator and the detuning "Δf" satisfy the following formula $1.1 \cdot \Delta f \leq fr \leq 0.9 \cdot fd.$

5 Claims, 10 Drawing Sheets

STRUCTURES FOR SUPPORTING VIBRATORS

This application claims the benefit of a Japanese Patent Application P2003-132920 filed on May 12, 2003, the entirety of which is incorporated by reference.

BACKGROUND OF THE INVENTION

1. Field of the Invention

The present invention provides a structure for supporting a vibrator.

2. Related Art Statement

It has been studied to use a vibratory gyroscope as a turning angular rate sensor employed in a vehicle control system of an automobile based on a vehicle turning rate feedback system. Such a system detects the direction of a steering wheel itself by a turning angle of the steering wheel. Simultaneously, the turning rate of the vehicle is detected by the vibratory gyroscope, The system finds a difference by comparing the direction of the steering wheel with the actual vehicle turning velocity, and attains a stable vehicle control by correcting a wheel torque and a steering angle on the basis of this difference.

In a vehicle control system, a vibratory gyroscope and its vibrator is subjected to a wide temperature range including high and low temperatures. Such temperature range normally includes minus 40° C. to plus 85° C. and may be more wider in a more severe specification. Particularly, when a vibrator is made of a piezoelectric single crystal, the temperature dependency of the single crystal may affect the stability of the gyroscope. The assignee filed a Japanese patent publication 2001-12955A. In the publication, a vibrator is adhered to a supporting member with an adhesive having a tan δ of not higher than 0.1 within the temperature range for use, for preventing the deviation of Q value of a detection vibration with temperature change.

Further, Japanese patent publication 2003-28648A discloses a member for supporting a vibrator for use in a vibratory gyroscope. According to the disclosure, the supporting member is composed of an elongate rod bent in a complex form so that the vibrator is supported with the rod. It is also described that the supporting member is electrically connected with an electrode formed on the vibrator.

According to such supporting method, however, a substantial temperature drift may be observed, for example, in a high temperature region. For example, as shown in FIG. 7, even when the driving impedance is constant in low to room temperature range, the driving impedance may be rapidly increased in a range of 60 to 70° C. to result in temperature drift.

SUMMARY OF THE INVENTION

An object of the present invention is to provide a novel structure of supporting a vibrator having a terminal for electrical connection so that the vibrator may be miniaturized, and the driving impedance can be made constant in a wide temperature range to reduce the temperature drift.

The present invention provides a structure for supporting a vibrator having a terminal for electrical connection. The structure has a substrate and a bonding wire supported on the surface of the substrate that is connected with the vibrator. The vibrator is supported with the bonding wire so that the vibrator does not contact the substrate and the bonding wire is electrically connected with the terminal. The resonance frequency "fr" of the supporting structure, the driving frequency "fd" for the vibrator and the detuning "Δf" satisfy the following formula.

$$1.1 \cdot \Delta f \leq fr \leq 0.9 \cdot fd$$

The inventors have noted a bonding wire for supplying an electrical signal into a terminal of a vibrator or sending a specific electrical signal from the terminal of a vibrator to a packaging substrate. They have thus reached the following idea. That is, a bonding wire is fixed on a substrate and joined with a vibrator so that the vibrator is supported over the surface of the substrate without direct contact with the substrate. A structural strength for supporting a vibrator above the substrate can be assured by means of the bonding wire by miniaturizing the vibrator.

According to such supporting method, however, a substantial temperature drift may occur, for example in a high temperature range as described above. The inventors have studied the mechanism of the temperature drift in a specific temperature range and reached the following findings. The inventors have set a specific model in which the driving frequency "fd" is about 40 kHz and the detuning frequency "Δf" is about 1 kHz. In this case, when a vibrator is supported with a bonding wire on the surface of a substrate in a relatively rigid manner, the resonance frequency "fr" of the whole supporting structure may be increased to approach the driving frequency "fd". In this case, the driving impedance may be elevated to result in a temperature drift, for example in a specific temperature range such as high and low temperature ranges.

On the other hand, the inventors have tried the following ideas for preventing an increase of the driving impedance due to resonance of the driving frequency "fd" and supporting structure. That is, many bent parts are formed in a bonding wire, or the dimension of a deflection or curve in a bonding wire is made larger so that the vibrator can be supported in a more flexible manner. In this case, however, it is found that so called detuning noise may be observed. A detuning frequency is a difference between the driving frequency "fd" and detection frequency. When a change of an angular rate having an alternating pattern with the same frequency as the detuning frequency is applied, the detection sensitivity is increased due to the resonance. The sensitivity of detection of the angular rate component is increased to a value higher than a designed value, so that the measured value of the angular rate is made larger than its true value due to the influence of the detuning noise. An increase of the sensitivity is positively correlated with the Q value of the detection vibration. The influence of the detuning noise is particularly considerable when a vibrator made of quartz is used.

Based on the above findings, it is found that the above temperature drift can be reduced by supporting an vibrator on the surface of a substrate satisfying the following formula.

$$1.1 \cdot \Delta f \leq fr \leq 0.9 \cdot fd$$

("fr" is a resonance frequency "fr" of the supporting structure, "fd" is a driving frequency for the vibrator and "Δf" is a detuning)

The resonance frequency "fr" of the supporting structure is made 0.9 times or lower of the driving frequency "fd" of a vibrator. On the viewpoint of the present invention, "fr" may more preferably be 0.5 times or lower of "fd". Further, a difference between "fr" and "fd" may preferably be 4 kHz or larger, and more preferably be 20 kHz or larger.

The resonance frequency "fr" of the supporting structure is made 1.1 times or larger of the detuning "Δf". On the viewpoint of the present invention, the resonance frequency "fr" may preferably be 1.5 times or larger, and more preferably be 2 times or larger, of the detuning Δf.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

Figure 1:
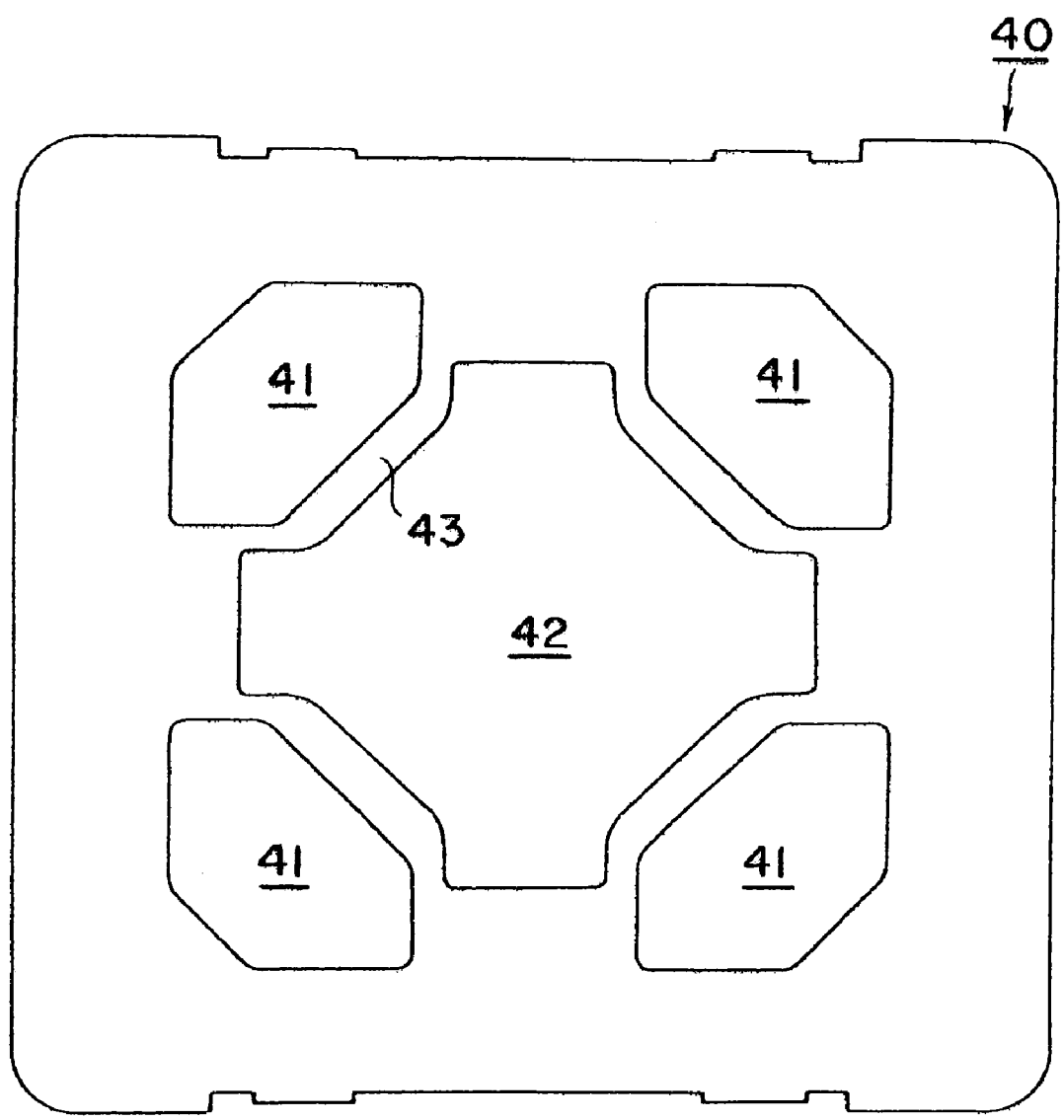
FIG. 1 is a plan view showing a frame 40 made of a conductive material.

The present invention will be described in detail referring to the attached drawings.

The material of the vibrator is not particularly limited, and may preferably be a piezoelectric single crystal. The material may more preferably be a piezoelectric single crystal selected from the group consisting of quartz, lithium niobate, lithium tantalate, lithium niobate-lithium tantalate solid solution, lithium borate and langasite.

The dimensions of the vibrator are not particularly limited. However, if the weight or dimensions of the vibrator is too large, too much weight may be applied on the bonding wire to possibly deform the bonding wire over a long period of time. The width of the vibrator may preferably be not larger than 10 mm and more preferably be not larger than 5 mm for preventing adverse effects of the deformation of the bonding wire on the vibration. On this viewpoint, the weight of the vibrator may preferably be not larger than 5 mg and more preferably be not larger than 1 mg. Further, the thickness of the vibrator may preferably be not larger than 0.3 mm and more preferably be not larger than 0.2 mm.

The material for a substrate is not particularly limited and may be an insulating material, used for a package, such a ceramics, glass or resin.

The bonding wire may be joined with the vibrator by means of a process not particularly limited including ultrasonic bonding, spot welding, a conductive adhesive or soldering.

The bonding wire is electrically connected with the terminal of the vibrator. In a preferred embodiment, the bonding wire is joined with the terminal of the vibrator. The bonding wire is, however, not necessarily directly joined with the terminal. For example, the tip end of the bonding wire may be joined with the vibrator at a region other than the terminal. In this case, the tip end of the bonding wire and the terminal may be electrically connected through a wiring on the vibrator or through an electric cable separate from the vibrator.

It is necessary to support the vibrator so that the vibrator does not directly contact the substrate for preventing the adverse effects on the vibration. In a preferred embodiment, the distance between the vibrator and substrate is not smaller than 0.1 mm and more preferably is not smaller than 0.2 mm.

The bonding wire is made of a conductive material not particularly limited, and may preferably be flexible or deformable. On this viewpoint, the material may be copper with gold plating, nickel with gold plating, nickel or aluminum.

The width and thickness of the bonding wire are not particularly limited, and may preferably be not smaller than 25 μm and 10 μm, respectively, and more preferably be not smaller than 50 μm and 20 μm, respectively, for stably supporting the vibrator for a long period of time. The width and thickness of the bonding wire may preferably be not larger than 200 μm and 80 μm, respectively, and more preferably be not larger than 100 μm and 40 μm, respectively, for miniaturize the whole supporting structure.

The upper face of the vibrator may be supported by means of the bonding wire. In this case, the vibrator is suspended from the end parts of the bonding wires. Such structure is preferred for reducing the thickness of the whole supporting structure.

Alternatively, the lower face of the vibrator may be supported with the bonding wires. Such structure is preferred for supporting the vibrator for a long period of time with stability.

The kind of the substrate is not particularly limited and may preferably be a substrate for a package.

In a preferred embodiment, a plurality of bonding wires for a signal electrode for detection are provided. A first bonding wire for a signal electrode for driving has a first connecting part, and a second bonding wire for a ground electrode for driving has a second connecting part. The bonding wires for the signal electrode for detection are provided in positions substantially symmetrical with respect to a straight line connecting the first and second connecting parts. Further, in a preferred embodiment, a plurality of bonding wires for a ground electrode for detection are provided. The bonding wires for the ground electrode for detection are provided in positions substantially symmetrical with respect to a straight line connecting the first and second connecting parts.

FIGS. 1 to 5 relate to this embodiment. FIG. 1 shows a frame 40 composed of an insulating material. The frame 40 has a center hole 42 for positioning a vibrator and four through holes 41 surrounding the central hole 42. 43 represents a bridge part. The frame 40 according to the present example is made of a conductive material and mounted on the surface of the substrate.

Figure 2:
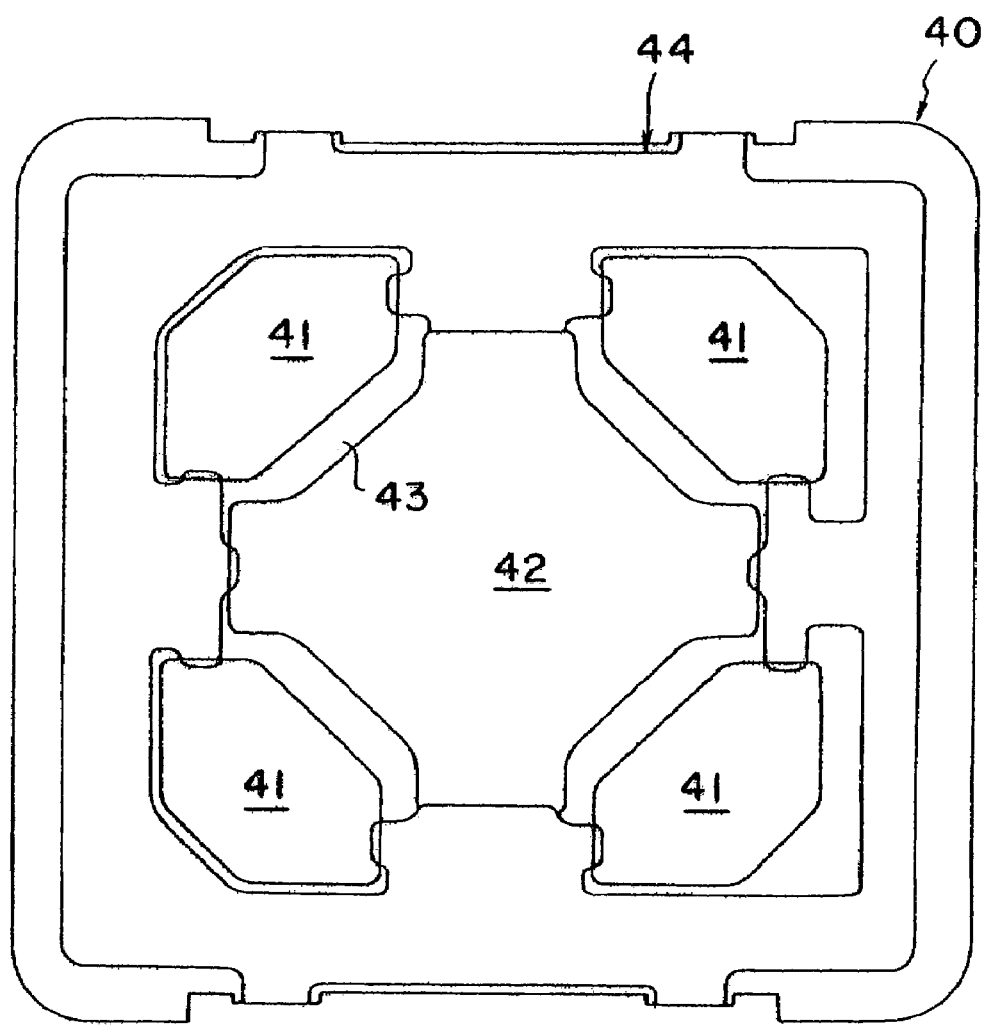
FIG. 2 is a plan view showing a frame 40 and an insulator 44.
Figure 3:
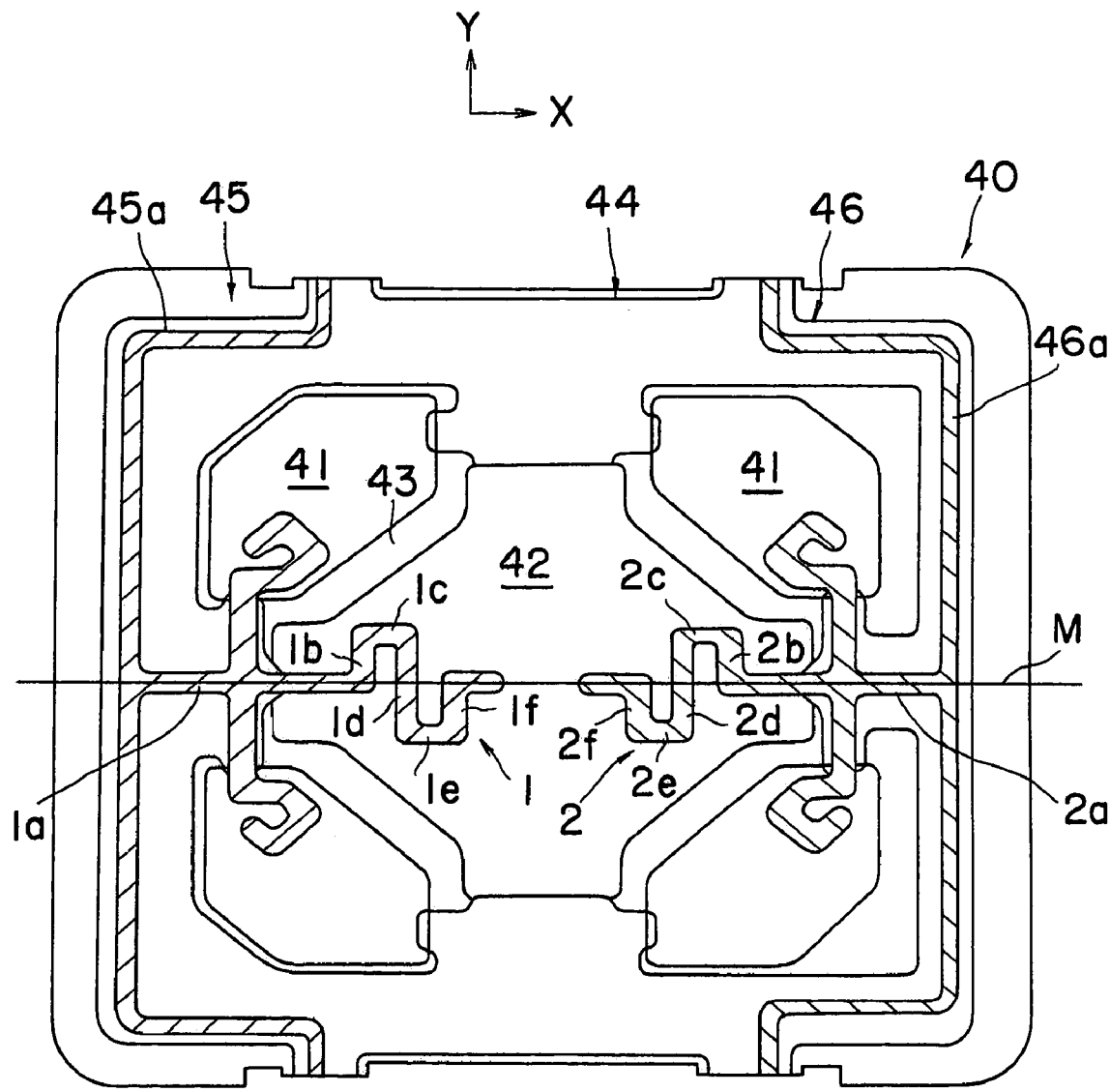
FIG. 3 is a plan view showing a frame 40, insulator 44, bonding wires 45 for a signal electrode for driving, and bonding wires 46 for a ground electrode for driving.
Figure 4:
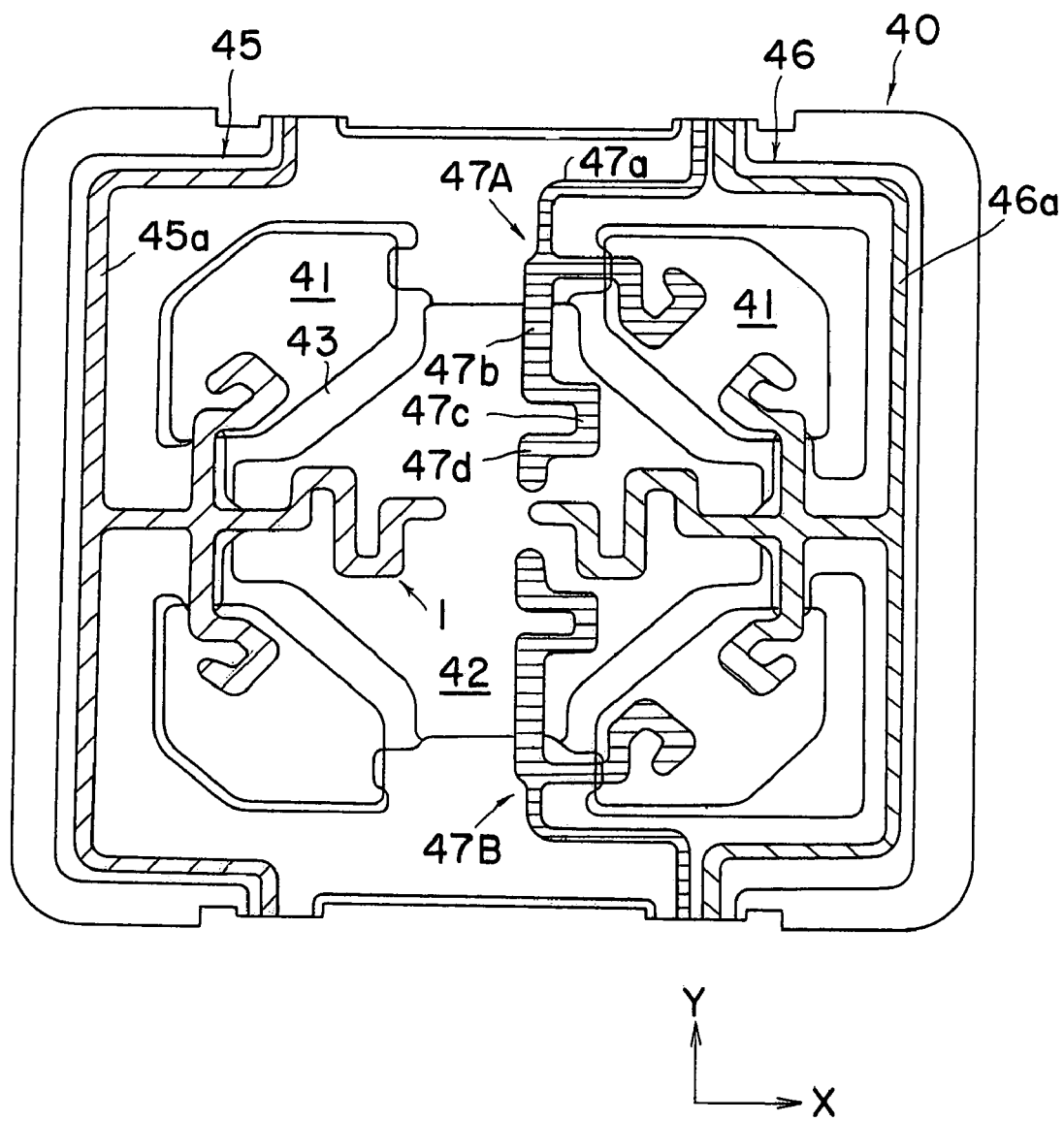
FIG. 4 is a plan view showing a frame 40, insulator 44, bonding wires 45 for a signal electrode for driving, bonding wires 46 for a ground electrode for driving and bonding wires 47A, 47B for a signal electrode for detection.
Figure 5:
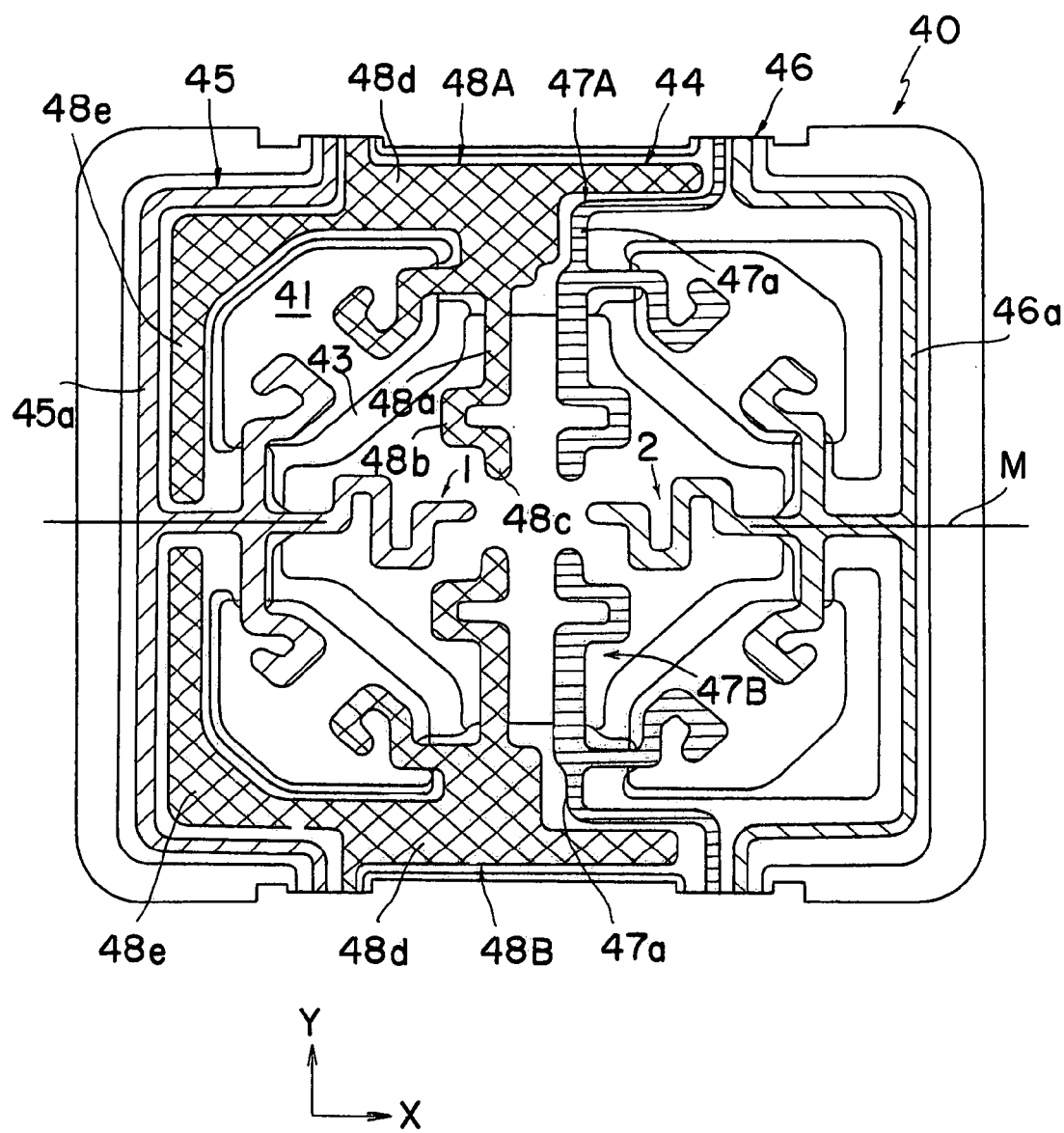
FIG. 5 is a plan view showing a supporting structure.

FIG. 2 shows the frame 40 and an insulator 44 mounted on the frame 40. FIG. 3 further shows bonding wires 45 for the signal electrode for driving and bonding wires 46 for the ground electrodes for driving mounted on the insulator 44. FIG. 4 still further shows bonding wires 47A and 47B for the signal electrodes for detection mounted on the insulator. FIG. 5 still further shows bonding wires 48A and 48B for the ground electrode for detection mounted on the insulator.

For example as shown in FIGS. 3 and 4, the bonding wire 45 for the signal electrode for driving has a wiring 45a and a protrusion 1 into the central hole 42. The protrusion 1 has a portion 1b extending in a direction of Y axis, bent portions 1c and 1d, a portion 1e extending in a direction of X axis and a connecting portion if for the connection to electrode pads of the vibrator 1. The bonding wire 45 is connected with the signal electrode for exciting a driving vibration in the vibrator. The bonding wire 46 for the ground electrode for driving has a wiring 46a, a protrusion 2 into the central hole 42. The protrusion 2 has a portion 2b extending in a direction of Y axis, bent portions 2c and 2d, a portion 2e extending in a direction of X axis and a connecting portion 2f for the connection to electrode pads of the vibrator 1. The bonding wire 46 is connected with the ground electrode for exciting a driving vibration in the vibrator. In the present example, the connecting part 1f of the wire 45 and connecting part 2f of the wire 46 are opposed to each other. "M" is a straight line connecting the connecting parts 1f and 2f.

As shown in FIG. 4, each of the bonding wires 47A and 47B for the signal electrode for detection has a wiring 47a, a protrusion 47b into the central hole 42, a bent portion 47c and connecting part 47d for an electrode pad of a vibrator.

As shown in FIG. 5, each of the bonding wires 48A and 48B for the ground electrode for detection has a wiring 48d, a protrusion 48a into the central hole 42, a connecting part 48c to the electrode pad of the vibrator and a guard electrode portion 48d. The wires 48A and 48B are grounded to the mounting face of the substrate.

In the present example, the straight line "M" connects the connecting part if of the bonding wire for the signal electrode for driving and connecting part 2f of the wire for the ground electrode for driving. The bonding wires 47A and 47B for the signal electrode for detection are provided in positions substantially symmetrical with respect to the straight line "M". Further, a plurality of the bonding wires 48A and 48B for the ground electrode for detection are provided in positions substantially symmetrical with respect to the straight line "M".

The advantages will be described below. The inventors have tried to install a vibratory gyroscope in a small electronic device such as a mobile phone. It is thus necessary to considerably reduce the dimensions of a vibrator to, for example, several millimeters. In a vibrator having such small dimensions, electrostatic coupling may be induced to generate a noise. Such electrostatic coupling has not been considered problematic in a prior vibrator. In a vibrator having a reduced dimension, the distance between adjacent pads on the vibrator may be as small as, for example, about 50 micrometer. In a vibrator and pads having such small dimensions, the contribution of electrostatic coupling between the signal pad for driving and that for detection may be considerable. As a result, when a difference between measured values from two detecting systems in a vibrator standing still, the difference may not be zero due to the contribution of electrostatic coupling to generate a noise. Further, when an ambient temperature is changed, the electrostatic coupling may generate a zero-point temperature drift.

On the contrary, the bonding wires 47A and 47B for the signal electrode for detection are provided in positions substantially symmetrical with respect to the straight line "M". It is thus possible to cancel the noises having the same phase and amplitude and thus to effectively reduce the noise due to the contribution of the electrostatic coupling. Further, it is also effective to provide a plurality of the bonding wires 48A and 48B for the ground electrode for detection in positions substantially symmetrical with respect to the straight line "M".

In a preferred embodiment, the shapes of the wires 47A and 47B for the signal electrode for detection are substantially symmetrical with each other with respect to the straight line "M". That is, the shapes of the wires 47A and 47b are the substantially same. It is not, however, required that the shapes of the wires are the same.

The shape or pattern of the vibrator is not limited. In a preferred embodiment, the vibrator has a bending vibration piece and a fixing portion fixing the piece. The fixing portion is connected with the bonding wire. It is thus possible to minimize the influences of the supporting structure on the bending vibration of the piece and to reduce the deviation of vibration among vibrators due to the influences of the supporting structure.

Figure 6:
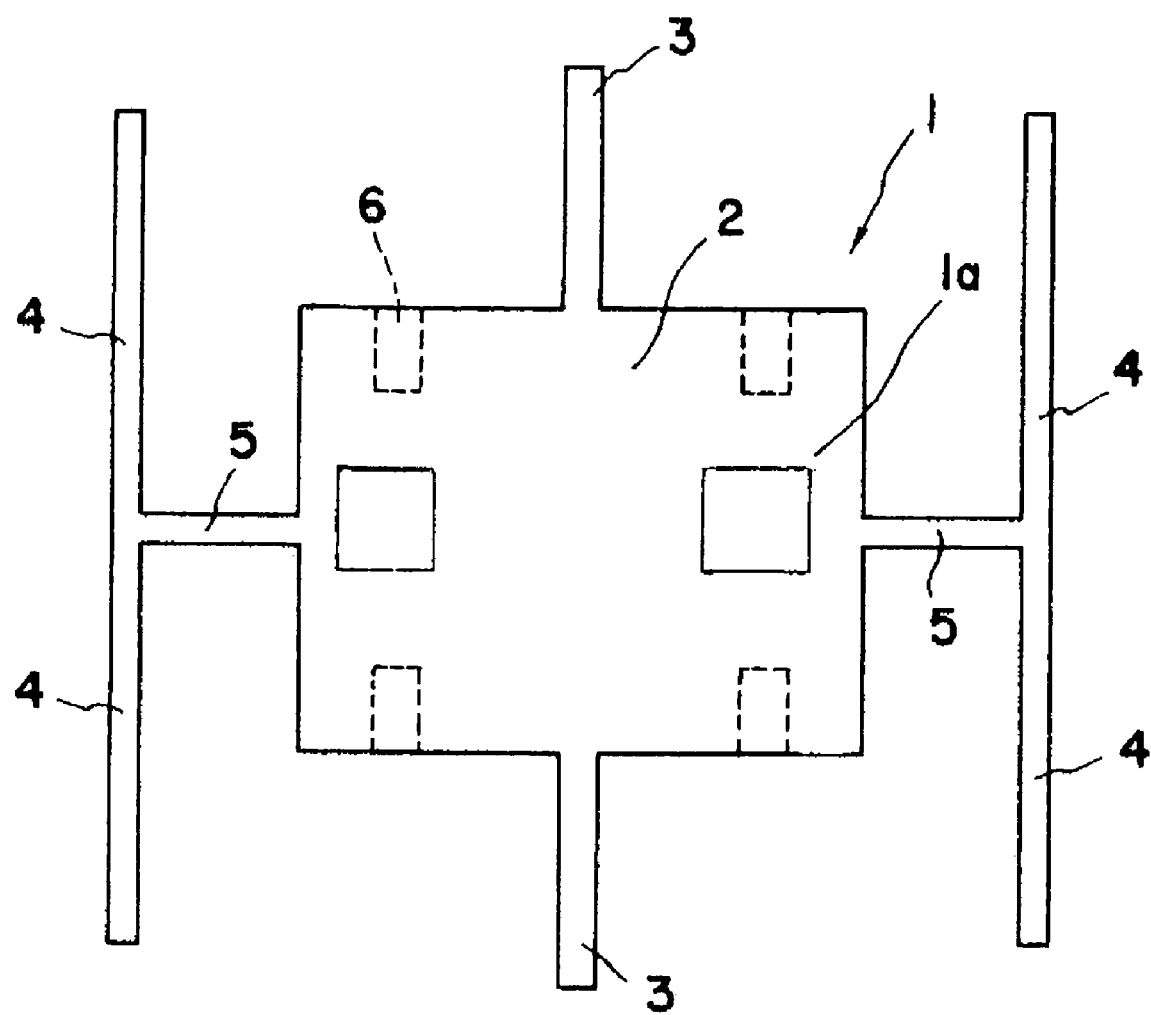
FIG. 6 is a plan view showing a vibrator 1.

FIG. 6 shows a vibrator 1 according to the present embodiment. The vibrator 1 has a fixing portion 2, and a pair of detection vibration pieces 3 protruding from the fixing portion 2. The vibrator further has a pair of supporting portions 5 protruding from the fixing portion 2 and driving vibration pieces 4 provided at the ends of the supporting portions 5. When driving vibration is excited in the vibrator, each driving vibration piece 4 vibrates around the base of the piece 4 to the supporting portion 5 as its fulcrum. The vibrator 1 is rotated around a rotating axis (Z-axis) extending in a direction perpendicular to the vibrator 1. The supporting portion 5 then vibrates in bending vibration mode around the base of the supporting portion 5 to the fixing portion 2 as its fulcrum. Responsive to the vibration, each detection vibration piece 3 vibrates in bending vibration mode around the base of the piece 3 to the fixing portion 2. Each detection vibration piece 3 generates electrical signal corresponding to the detection vibration. The electrical signal is then utilized to calculate a turning angular rate around the rotating axis (Z axis).

A terminal 6 is provided on the fixing part 2. The terminal 6 is electrically connected with electrodes on the driving and detection vibration pieces through wirings not shown. The bonding wires are thus electrically connected with the terminals In a preferred embodiment, the vibrator is used for a vibratory gyroscope for detecting a turning angular rate.

Figure 8:
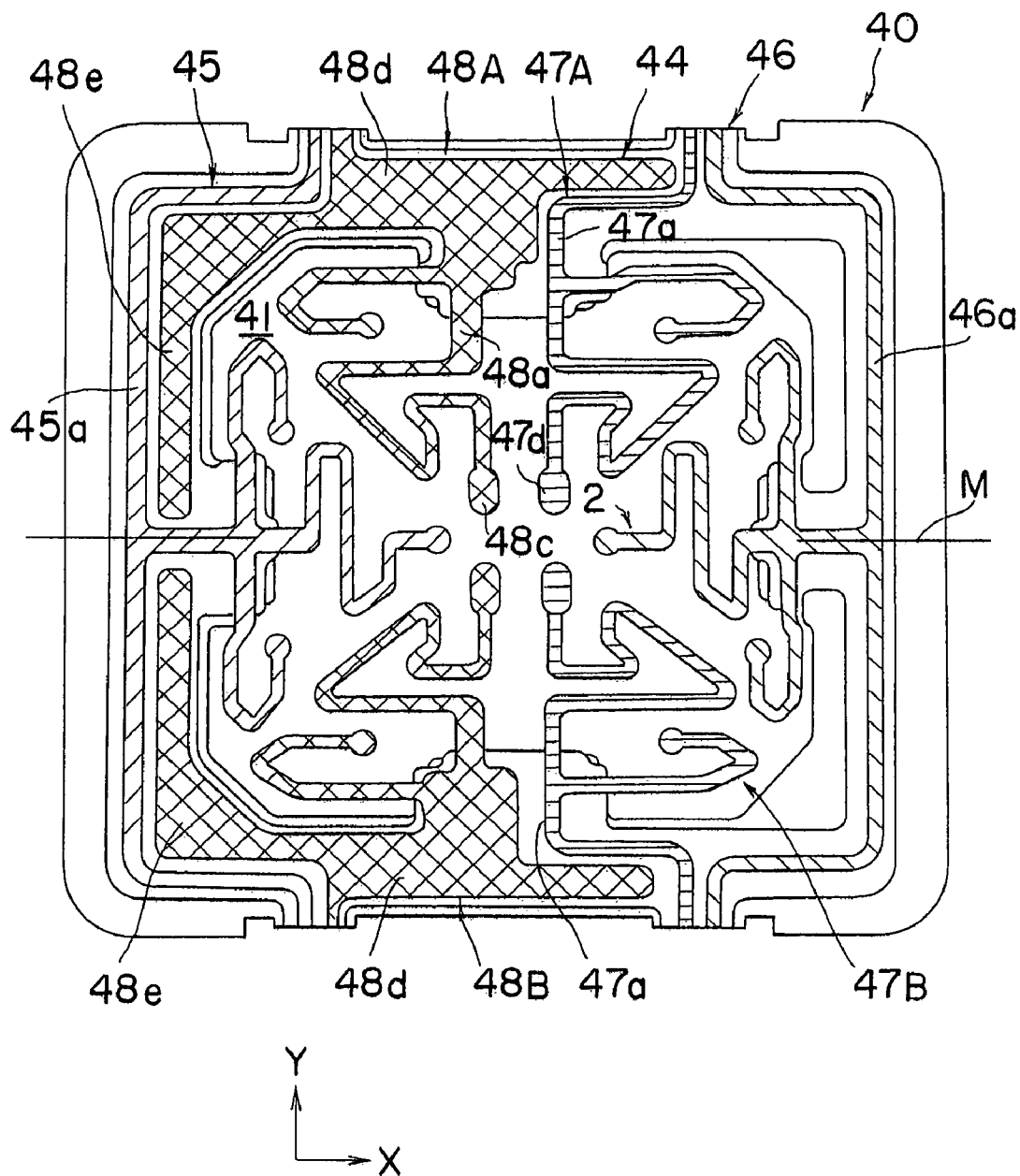
FIG. 8 is a plan view schematically showing a supporting structure according to another embodiment of the present invention.
Figure 9:
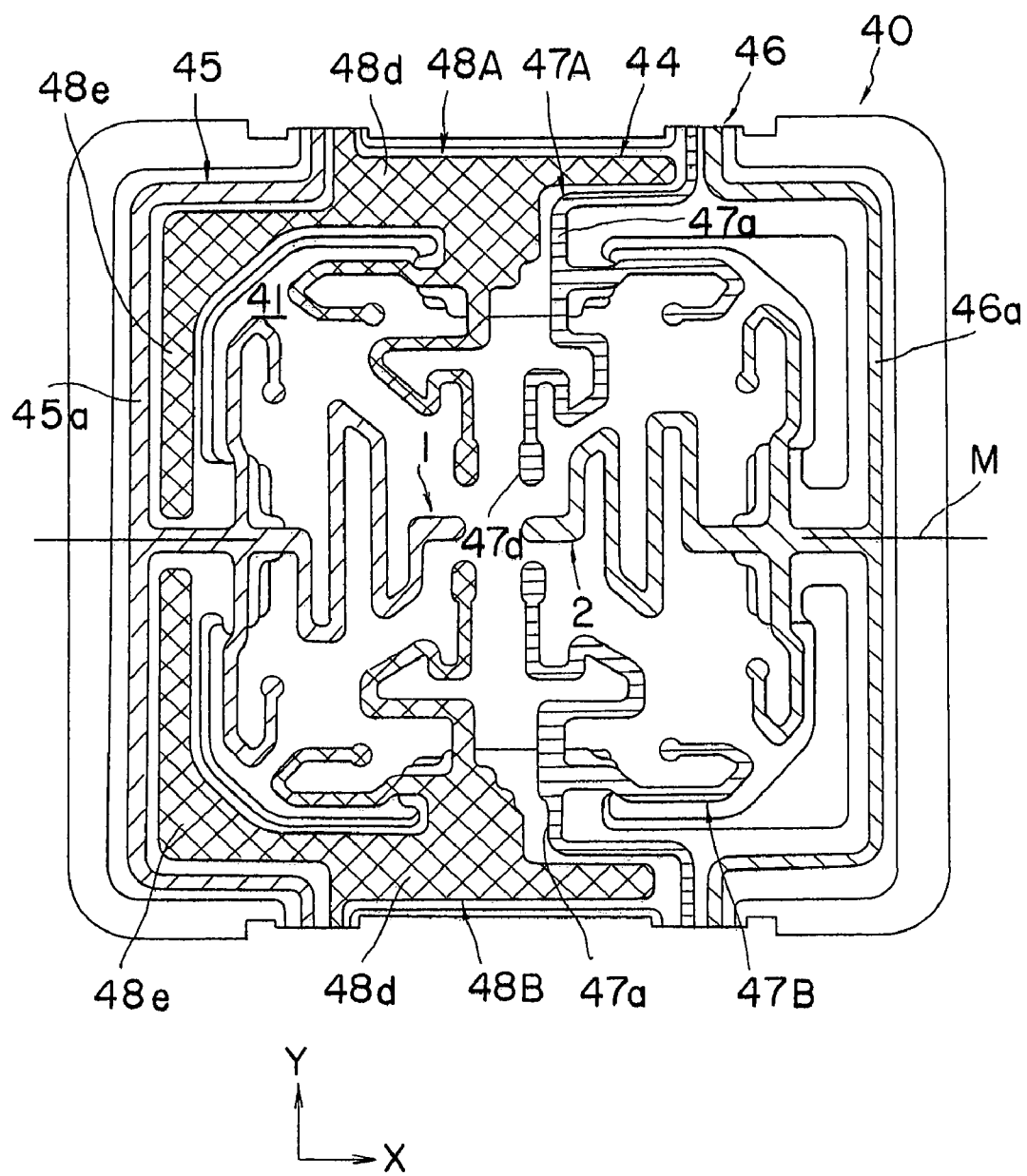
FIG. 9 is a plan view schematically showing a supporting structure according to still another embodiment of the present invention.
Figure 10:
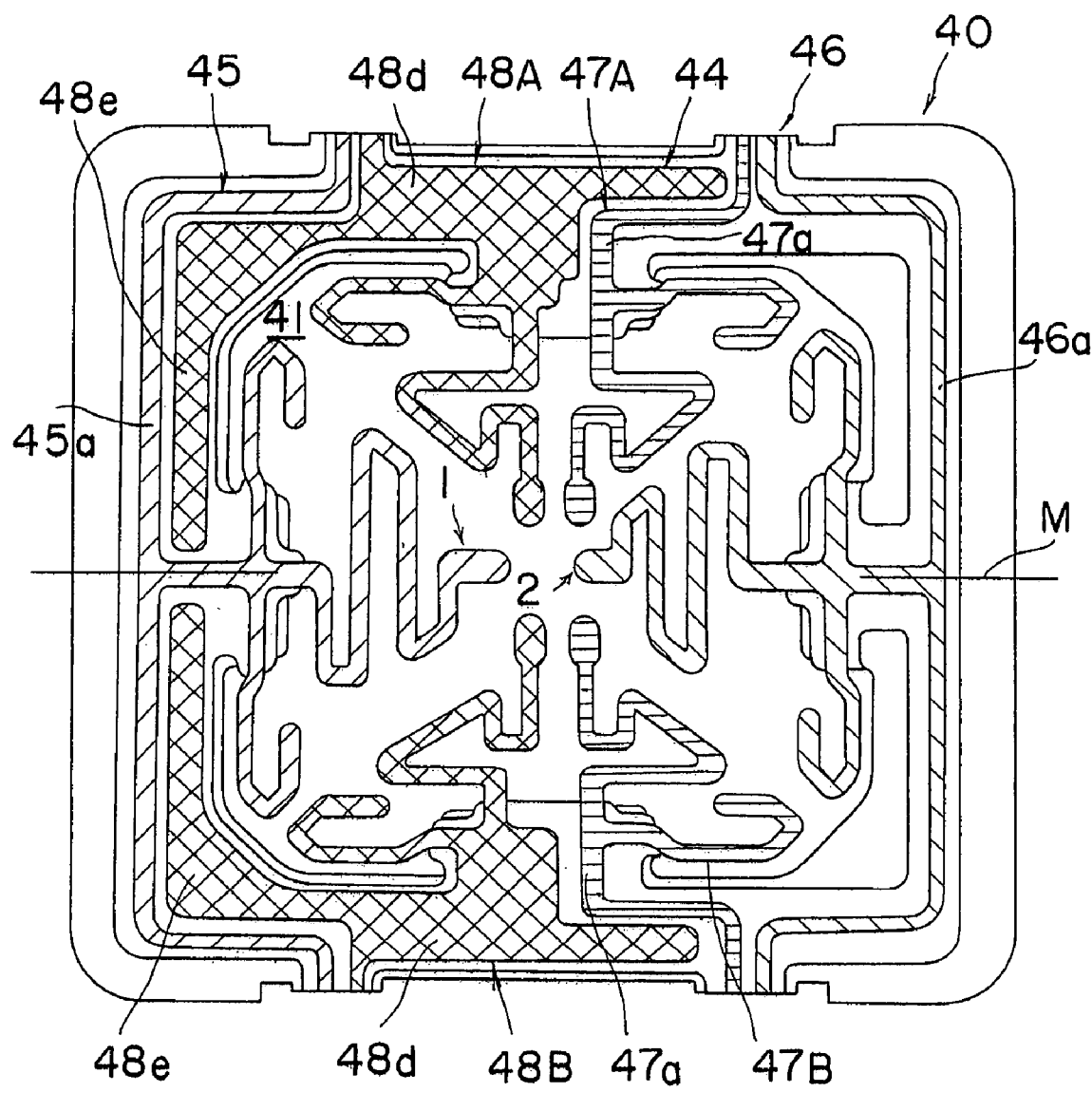
FIG. 10 is a plan view schematically showing a supporting structure according to still another embodiment of the present invention.

FIGS. 8, 9 and 10 are plan views each schematically showing supporting structures similar to that shown in FIG. 5, respectively. In each of the supporting structures of FIGS. 8, 9 and 10, the bonding wires 47A and 47B for the signal electrode for detection are provided in positions substantially symmetrical with respect to the straight line "M". The line "M" connects the connecting part 1f of the bonding wire for the signal electrode for driving and the connecting part 2f of the bonding wire of the ground electrode for driving. Further, the bonding wires 48A and 48B for the ground electrodes for detection are provided at positions substantially symmetrical with respect to the straight line "M".

EXAMPLES

A vibrator shown in FIG. 6 was produced and mounted on the supporting structure shown in FIGS. 1 to 5. A chromium mm of 100 angstroms in thickness and a gold film of 1500 angstroms in thickness were formed in predetermined regions on a wafer made of a Z-plate of quartz with a thickness of 0.1 mm, by sputtering. Both main faces of the wafer were coated with resist films.

The wafer was then immersed in aqueous solution of iodine and potassium iodide to remove excessive gold in the gold film by etching, and was further immersed in aqueous solution of cerium-ammonium nitrate and perchloric acid to remove excessive chromium in the chromium film by etching. The wafer was etched by immersing the wafer in ammonium bifluoride at a temperature of 80° C. for 20 hours to form the external shape of the vibrator. A gold film having a thickness of 2000 angstrom is formed as a film for electrode on the chromium film having a thickness of 100 angstrom using a metal mask. The vibrator 1 had a length of 2 mm, width of 2 mm, thickness of 0.1 mm and weight of about 0.2 mg.

The vibrator 1 was mounted in a package. The substrate was formed of alumina ceramics, the contact pads were formed of gold, the frame 40 was formed of SUS, and the insulator 44 was formed of polyimide resin. The bonding wires were produced by plating a copper film wire with gold. The bonding wires had a shape of straight line (comparative example), or a plurality of bent portions (inventive example). The bonding wires were joined with the insulator 44 with an adhesive and with the vibrator 1 by means of ultrasonic bonding.

In the inventive examples, each of the bonding wires had a shape shown in FIGS. 3 to 5, and the width and thickness were adjusted so that the resonance frequency "fr" of the supporting structure, the driving frequency "fd" of the vibrator and the detuning "Δf" were adjusted as described below. In the comparative example, a bent part is not provided in each of the bonding wires, and the width and thickness were adjusted so that the resonance frequency "fr" of the supporting structure, the driving frequency "fd" of the vibrator and the detuning "Δf" were adjusted as described below.

TABLE 1

|  | Inventive Example (kHz) | Comparative Example (kHz) |
|---|---|---|
| fr: | 36 | 1000 |
| fd: | 44 | 44 |
| Δf: | 1 | 1 |

Figure 7:
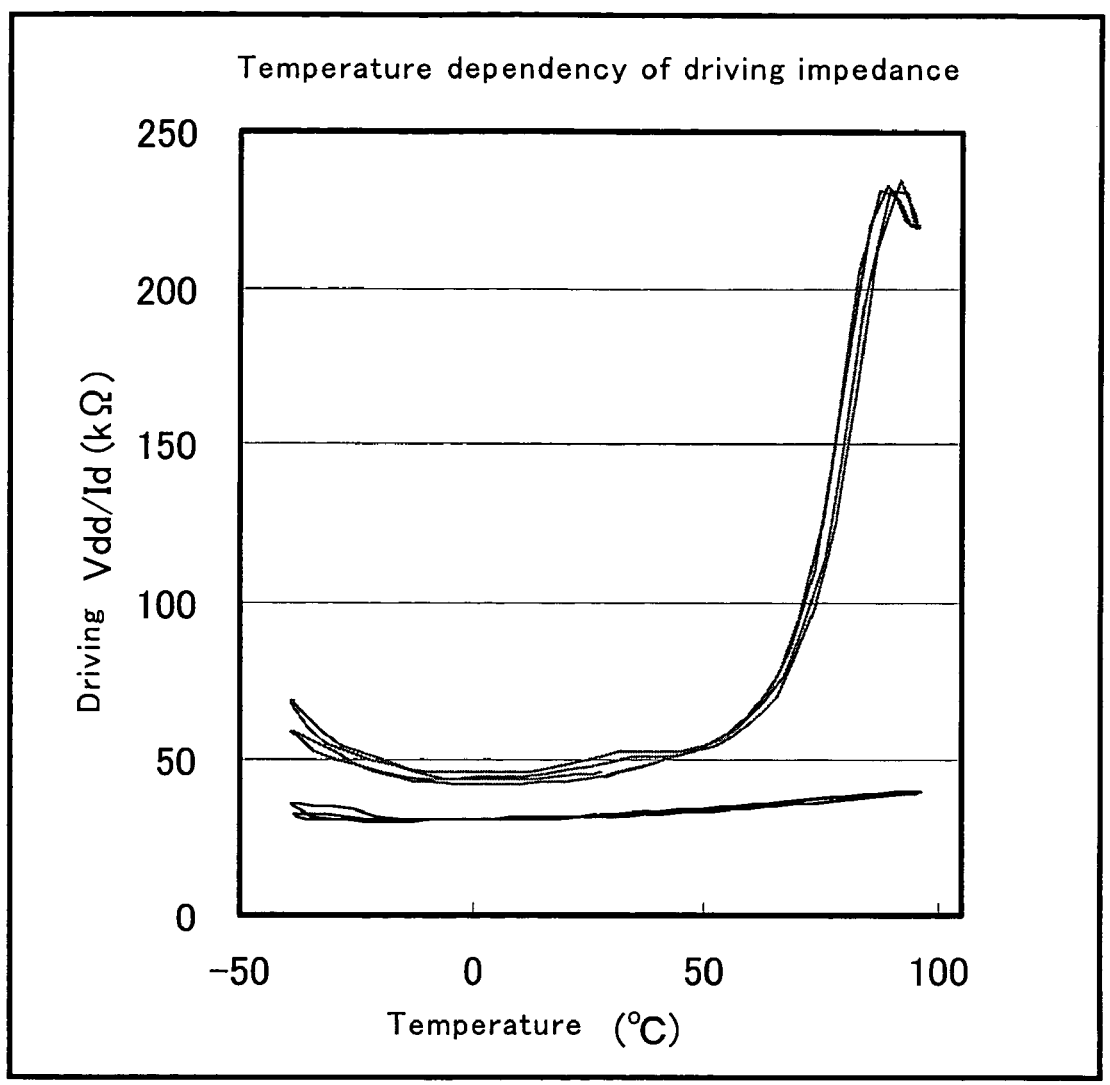
FIG. 7 is a graph showing temperature dependency of driving impedance.

The temperature dependency of the driving impedance in a range of −40° C. to +85° C. was measured for each example, and the results were shown in FIG. 7. In the comparative example (the upper graph), the driving impedance was considerably increased in a temperature range of about 60° C. or higher. Contrary to this, in the inventive example (lower graph), the driving impedance was gradually and linearly changed over the whole temperature range of −40° C. to +85° C. without a substantial temperature drift.

As described above, the present invention provides a novel structure for supporting a vibrator having a terminal for electrical connection. According to the structure, the vibrator can be miniaturized and the driving impedance can be made constant over a wide temperature range to reduce the temperature drift.

The present invention has been explained referring to the preferred embodiments, however, the present invention is not limited to the illustrated embodiments which are given by way of examples only, and may be carried out in various modes without departing from the scope of the invention.

The invention claimed is:

1. A structure for supporting a vibrator comprising a terminal for electrical connection, a signal electrode for driving, a ground electrode for driving, a signal electrode for detection, and a ground electrode for detection, said structure comprising:

a substrate;

a frame provided on said substrate;

a center hole formed inside of said frame;

a bonding wire supported on a surface of said substrate, connected to said vibrator and fixed to said frame;

wherein said vibrator is supported with said bonding wire so that said vibrator does not directly contact said substrate, at least a part of said vibrator is positioned over said center hole and said bonding wire is electrically connected with said terminal, and wherein the resonance frequency "fr" of said supporting structure, the driving frequency "fd" for said vibrator and the detuning "Δf" satisfy the following formula:

$$1.1 \cdot \Delta f \leq fr \leq 0.9 \cdot fd.$$

2. The structure of claim 1, wherein said bonding wire is bent.

3. The structure of claim 1, wherein said bonding wire comprises a plurality of bent portions formed along axes perpendicular to each other, respectively, over said surface of said substrate.

4. The structure of claim 1, wherein said substrate is a substrate for a package.

5. The structure of claim 1, wherein said vibrator is a vibrator for a vibratory gyroscope for detecting a turning angular rate.

* * * * *